United States Patent [19]

Isaacs et al.

[11] Patent Number: 5,789,930
[45] Date of Patent: Aug. 4, 1998

[54] APPARATUS AND METHOD TO TEST FOR KNOWN GOOD DIE

[75] Inventors: Phillip Duane Isaacs, Rochester, Minn.; David Allen Sluzewski, San Jose, Calif.; Mark Kenneth Hoffmeyer, Rochester, Minn.

[73] Assignee: International Business Machine Corporation, Armonk, N.Y.

[21] Appl. No.: 572,591

[22] Filed: Dec. 14, 1995

[51] Int. Cl.$^6$ .................................................. G01R 31/02
[52] U.S. Cl. .................................. 324/754; 438/15
[58] Field of Search ..................... 324/754, 765; 438/14, 15, 17

[56] References Cited

U.S. PATENT DOCUMENTS

| | | | |
|---|---|---|---|
| 4,604,644 | 8/1986 | Beckham et al. | 257/737 |
| 4,899,107 | 2/1990 | Corbett et al. | 324/158 F |
| 4,937,203 | 6/1990 | Eichelberger et al. | 437/51 |
| 5,056,706 | 10/1991 | Dolbear et al. | 228/180.21 |
| 5,123,850 | 6/1992 | Elder et al. | 439/67 |
| 5,170,930 | 12/1992 | Dolbear et al. | 228/123.1 |
| 5,302,891 | 4/1994 | Wood et al. | 324/158 F |
| 5,336,649 | 8/1994 | Kinsman et al. | 437/209 |
| 5,342,206 | 8/1994 | Grabbe et al. | 439/71 |
| 5,367,253 | 11/1994 | Wood et al. | 324/158.1 |
| 5,397,245 | 3/1995 | Roebuck et al. | 439/264 |
| 5,414,372 | 5/1995 | Levy | 324/765 |
| 5,494,856 | 2/1996 | Beaumont et al. | 437/209 |

FOREIGN PATENT DOCUMENTS 0 637 070 A1  2/1995  European Pat. Off. ........ H01L 21/60

OTHER PUBLICATIONS

IBM Technical Disclosure Bulletin, V. 37, No. 02B, Feb. 1994; "Improvements in the Sacrificial Substrate Burn-in Methodology for Known Good Die".
IBM Docket EN9-94-087; "Temporary KGD Contacting Device for Wireband Chips"(Dec. '94).
IBM Docket BU9-93-048; "Universal Substrate/Chip Fixture"(Dec. '93).
IBM Technical Disclosure Bulletin, V. 33, No. 1A, Jun. 1990; "High-Performance Test System".

*Primary Examiner*—Ernest F. Karlsen
*Assistant Examiner*—Russell M. Kobert
*Attorney, Agent, or Firm*—Andrew J. Dillon

[57] ABSTRACT

The present invention may be characterized as an improved integrated circuit die testing system which includes a number of components which cooperate together. An integrated circuit carrier is provided for holding the integrated circuit die. Attached to the integrated circuit carrier is a chip site. Proximate to this chip site exists a plurality of contact pads. These contact pads are electrically coupled to a plurality of test points. Also provided is an integrated circuit die. Finally, a pattern of electrically conductive paste is provided. This electrically conductive paste electrically couples the integrated circuit die and the contact pads thereby allowing the integrated circuit die to be tested from the test points.

8 Claims, 6 Drawing Sheets

APPARATUS AND METHOD TO TEST FOR KNOWN GOOD DIE

BACKGROUND OF THE INVENTION

1. Technical Field

The present invention relates in general to integrated circuits, and in particular, to testing for known good die.

2. Description of the Related Art

In an effort to increase the computing power contained in a given electronic package, the semiconductor industry is proceeding with the development of electronic devices which contain several individual integrated circuit die. The devices which contain several die are known as multi-chip modules (MCMs). MCMs are used to combine different types of die, such as microprocessors and memory elements, for use in high performance computing applications.

A critical factor in making MCMs practical and cost-effective to produce and manufacture is the existence of "known good die." A known good die (KGD) is a semiconductor die which has undergone some amount of electrical testing in order to ensure its yield to a given confidence level. KGD are important to the development of MCMs because, in order for MCMs to be cost-effective, the reliability of the individual devices that make up the MCM must be very high.

Ordinarily, a die can be packaged, and then have its functionality tested. If the die passes the electrical tests, it is considered "good" and accepted as a functional unit. If the die fails the test, it is considered "bad" and rejected as being non-functional. The wasted cost of packaging a die that was bad from the start is not a tremendous economic problem. However, this is not the case with MCMs. In an MCM which contains four individual die, the packaging of a single bad die along with three other good die can be very expensive. In some circumstances, the single bad die that was packaged along with the three good die will cause all four die to be discarded. In other circumstances, the MCM can be re-worked, and the bad die can be removed. This process allows a semiconductor manufacture to avoid having to dispose of three good die, but the re-working process is itself expensive.

The semiconductor industry has been aware of this problem for some time. Their answer to this problem has been to develop test to determine the availability of KGD. By separating good die from bad die before progressing too far along in the manufacturing process, the semiconductor industry has made it economically feasible to assemble MCMs.

Integrated circuit manufacturers and others have developed a variety of methods to test silicon integrated circuit die for electrical functionality prior to attaching them to second level carriers. Testing is usually required for multi-chip modules (MCMs) to insure high assembly yields and cost effective manufacturing by eliminating the need for expensive assembly rework operations.

The prior art performs this testing in a variety of ways, most of which include bringing a matrix of probes into direct contact with the integrated circuit die or by physically attaching the testing probe to the integrated circuit die. These techniques have the disadvantage of being expensive and exposing the integrated circuit die to possible damage at the site of contact with the test probes.

Also, as the distance between the contacts on integrated circuit die shrink, making probing apparatuses with a tight enough pitch becomes very difficult. For example, today, the contact pitch can be as little as 0.009". This distance will surely decrease in the coming years. Making bed-of-nail type testing devices for use with such integrated circuit die is very expensive.

SUMMARY THE INVENTION

It is therefore one objective of the present invention to provide an improved integrated circuit die testing apparatus and method which effectively and inexpensively tests an integrated circuit die without exposing that integrated circuit die to the risk of damage by a testing probe. It is another objective of the present invention to provide an improved integrated circuit die testing apparatus and method which incorporates the testing of the integrated circuit die into the process of physically attaching the integrated circuit die to a printed circuit board.

These and other objectives are achieved as now described. The present invention may be characterized as an improved integrated circuit die testing system which includes a number of components which cooperate together. An integrated circuit carrier is provided for holding the integrated circuit die. Attached to the integrated circuit carrier is a chip site. Proximate to this chip site exists a plurality of contact pads. These contact pads are electrically coupled to a plurality of test points. Also provided is an integrated circuit die. Finally, a pattern of electrically conductive paste is provided. This electrically conductive paste electrically couples the integrated circuit die and the contact pads thereby allowing the integrated circuit die to be tested from the test points.

Having the integrated circuit die coupled to the integrated circuit carrier by means of electrically conductive paste provides several advantages over the prior art. First, if the integrated circuit carrier is a testing circuit board, integrated circuits can quickly and inexpensively be tested and removed from the test board without exposing the integrated circuit die to the possibly damaging effects of a test probe. Next, if the integrated circuit carrier is a printed circuit board, unreflowed solder paste can be used as the conductive paste. In this situation, integrated circuits that test good can be left in place on the printed circuit board and run through the reflow process to permanently attach them to the board. Integrated circuits that test bad can be removed from the printed circuit board and new integrated circuits inserted in their place without physically damaging the integrated circuit carrier.

BRIEF DESCRIPTION OF THE DRAWINGS

The novel features believed characteristic of the invention are set forth in the appended claims. The invention itself however, as well as a preferred mode of use, further objectives and advantages thereof, will best be understood by reference to the following detailed description of an illustrative embodiment when read in conjunction with the accompanying drawings, wherein:

DESCRIPTION OF THE PREFERRED EMBODIMENT

Figure 1A:
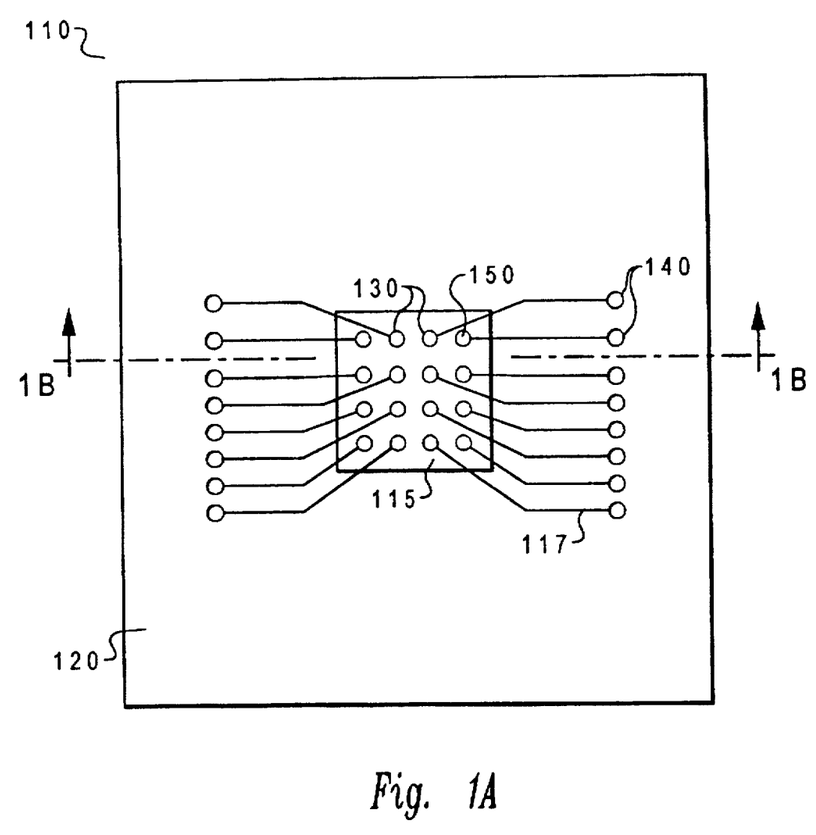
FIG. 1A depicts a testing apparatus with an implementation of the current invention.

With reference now to the figures, and in particular to FIG. 1A, there is depicted test apparatus 110. Test apparatus 110 is comprised of integrated circuit carrier 120. Integrated circuit carrier 120 contains a chip site 115, which in turn contains a plurality of contact pads 130. Contact pads 130 are in turn connected to a plurality of test points 140 by means of fanout circuitry 117. Test points 140 are shown as plated-through-holes (PTHs) in this example. Integrated circuit carrier 120 can be any device which is capable of holding an integrated circuit die and allowing it to function normally. Printed circuit boards are a very common type of integrated circuit carrier, as are Single Chip Module, Laminate; Multi Chip Module, Laminate; Single Chip Module, Ceramic; and Multi Chip Module, Ceramic.

Overlaying contact pads 130 is pattern of electrically conductive paste 150 that has been applied using traditional screen printing, stenciling, or positive displacement dispensing techniques. This paste is designed to be washable, that is, easily removed from both the integrated circuit carrier and any integrated circuit die which come into contact with integrated circuit carrier 120. This paste is made conductive through the incorporation of many conductive particles into the paste. Generally, the finer the particles used, the better the conductivity of the paste. In the preferred embodiment of the present invention, the electrically conductive paste used is ultra-fine solder paste which is soluble in water. Solder pastes which can be removed with CFCs are compatible with the present invention, but their use is being phased out due to environmental concerns. Other types of suitable paste include synthetic based, which are soluble in a water and saponifier solution, and rosin based, which are soluble in a terpene based solution.

Figure 1B:
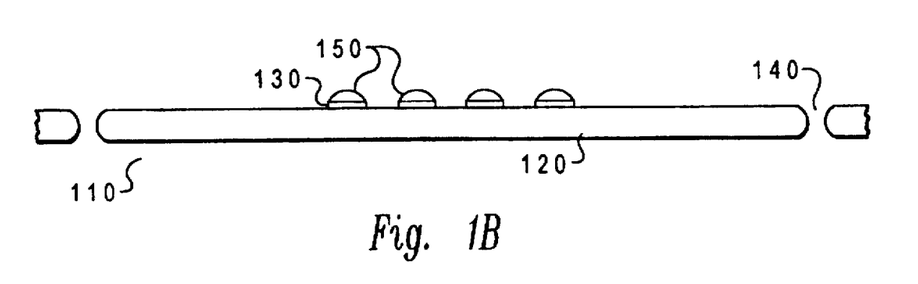
FIG. 1B shows a different perspective of FIG. 1A.

FIG. 1B shows test apparatus 110 from a different perspective. FIG. 1B better illustrates the placement of pattern of electrically paste 150 with respect to contact pads 130. Although the size of contact pads 130 and pattern of electrically conductive paste 150 has been exaggerated in FIGS. 1A and 1B, it can be seen that pattern of electrically conductive paste 150 has been placed on top of contact pads 130 in such a manner as to be capable of joining contact pads 130 to an integrated circuit die placed on top of contact pads 130. Also shown in FIG. 1B are the placement of test points 140, which as stated above, are PTHs in this particular embodiment.

Figure 2A:
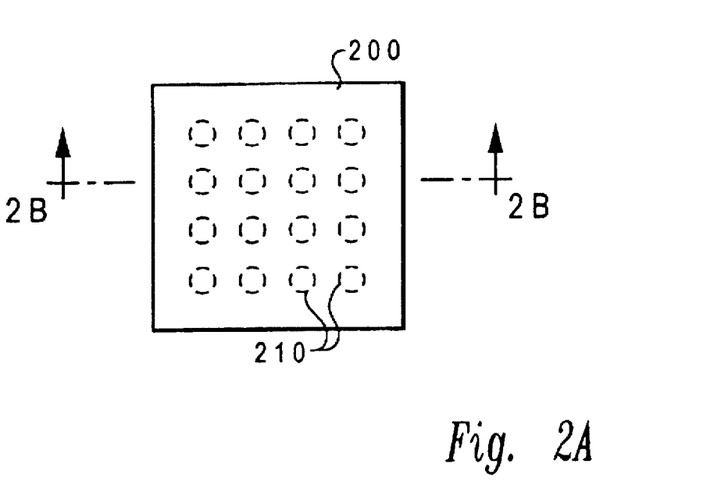
FIG. 2A illustrates an integrated circuit die suitable for use with the present invention.

Integrated circuit carrier 120 is designed to receive and secure an integrated circuit die to be tested. Such an integrated circuit die can be seen in FIG. 2A. FIG. 2A shows an integrated circuit die which is suitable for use with the current invention. FIG. 2A shows a top view of integrated circuit die 200. Integrated circuit die 200 shows an integrated circuit die containing a plurality of attachment pads 210. Attachment pads 210 may be peripheral pads, area array pads, solder bumps, C4 pads or other forms of attachments. The current invention allows for the electrical joining of integrated circuit die having many different types of contact means to an integrated circuit carrier. Also, integrated circuit die 200 shows only sixteen attachment pads 210. Integrated circuits having many more contact pads are within the scope of this invention. Test of the electrical continuity of 120 I/O integrated circuit chips and 625 I/O CBGA (ceramic ball grid array) modules have been accomplished using the current invention.

Figure 2B:
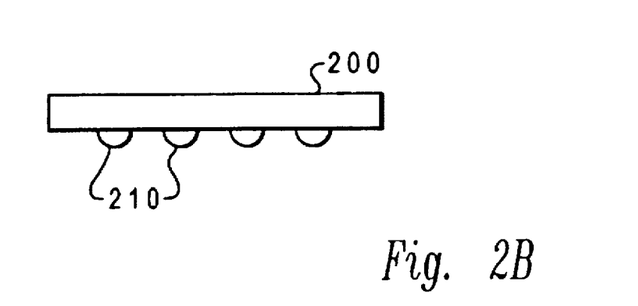
FIG. 2B shows a different perspective of FIG. 2A.

FIG. 2B shows integrated circuit die 200 from a different perspective. FIG. 2B better illustrates attachment pads 210. In FIG. 2B, attachment pads 210 are shown as solder bumps, but, as noted above, the current invention is suitable for use with integrated circuits possessing a range of attachment pads.

Figure 3A:
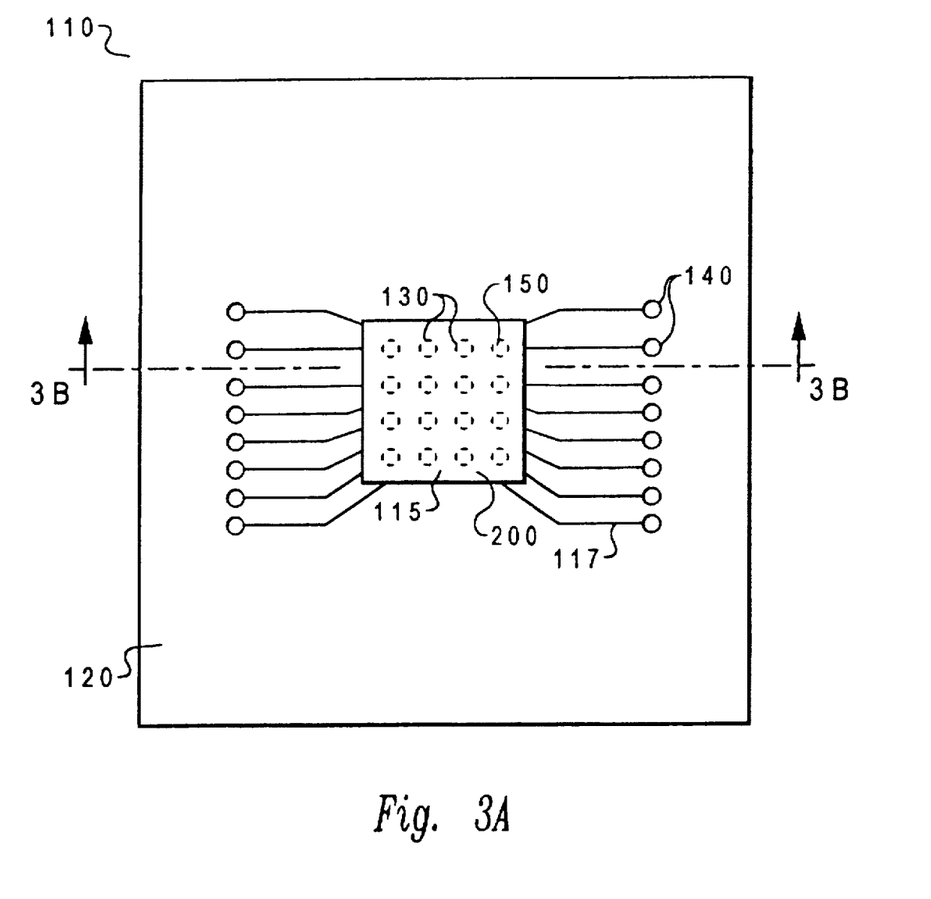
FIG. 3A shows the integrated circuit die of FIG. 2A and 2B being tested using the testing apparatus shown in FIG. 1A and 1B.

Integrated circuit die 200 shown in FIG. 2A can be tested using test apparatus 110, shown in FIG. 1A. FIG. 3A depicts test apparatus 110, shown in FIG. 1A, testing integrated circuit die 200, shown in FIG. 2A. To test integrated circuit die 200, the die is placed onto integrated circuit carrier 120. Once positioned correctly on integrated circuit carrier 120, integrated circuit die 200 is electrically joined to contact pads 130, and hence, the rest of test apparatus 110. Also included is pattern of electrically conductive paste 150. Pattern of electrically conductive paste 150 is the element which allows electricity to flow between contact pads 130 and integrated circuit die 200. Testing now can be performed from plurality of test points 140.

Figure 3B:
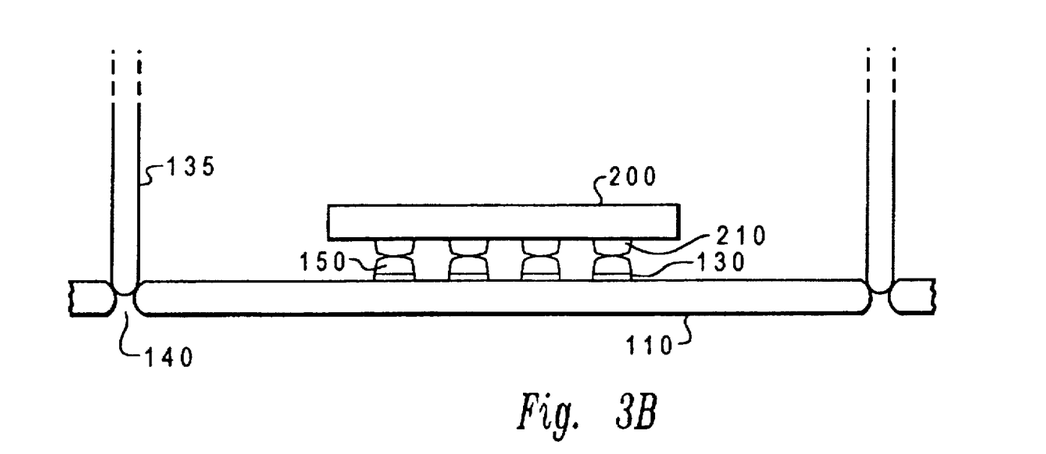
FIG. 3B shows a different perspective of FIG. 3A.

FIG. 3B shows the placement of integrated circuit die 200 upon test apparatus 110 from a different perspective. FIG. 3B clearly shows how attachment pads 210 are connected with contact pads 130 by means of pattern of electrically conductive paste 150. Probes 135 are shown being in contact with test points 140. These probes can be part of a bed-of-nails arrangement or other testing apparatus. Being in contact with test points 140 allows probes 135 to send and receive electrical test signals from integrated circuit die 200.

Testing from test points which are external to the integrated circuit die reduces the risk of damage to the integrated circuit die and decreases the cost of testing the die. Previous test techniques made a physical connection with the integrated circuit die, thus exposing it to possible damage from the test apparatus. In the current invention, the integrated circuit die is only contacted by the electrically conductive paste, thus reducing the likelihood that the die will be damaged. Also, the pitch of the test points can be at least an order of magnitude greater than the contacts on the integrated circuit die. This increased pitch allows for lower-cost test apparatuses to be used in testing the integrated circuit die.

After being electrically tested from plurality of test points 140, integrated circuit die 200 will be removed from test apparatus 110. If integrated circuit die 200 tested good, the die will then have the electrically conductive paste removed from it. This removal is accomplished through a washing process. After being washed, the die will then be subjected to a drying process which dries the die. The die will then be noted as having passed the electrical test, and will then be available for further use. If the integrated circuit die tested bad, the die will be discarded.

Figure 4A:
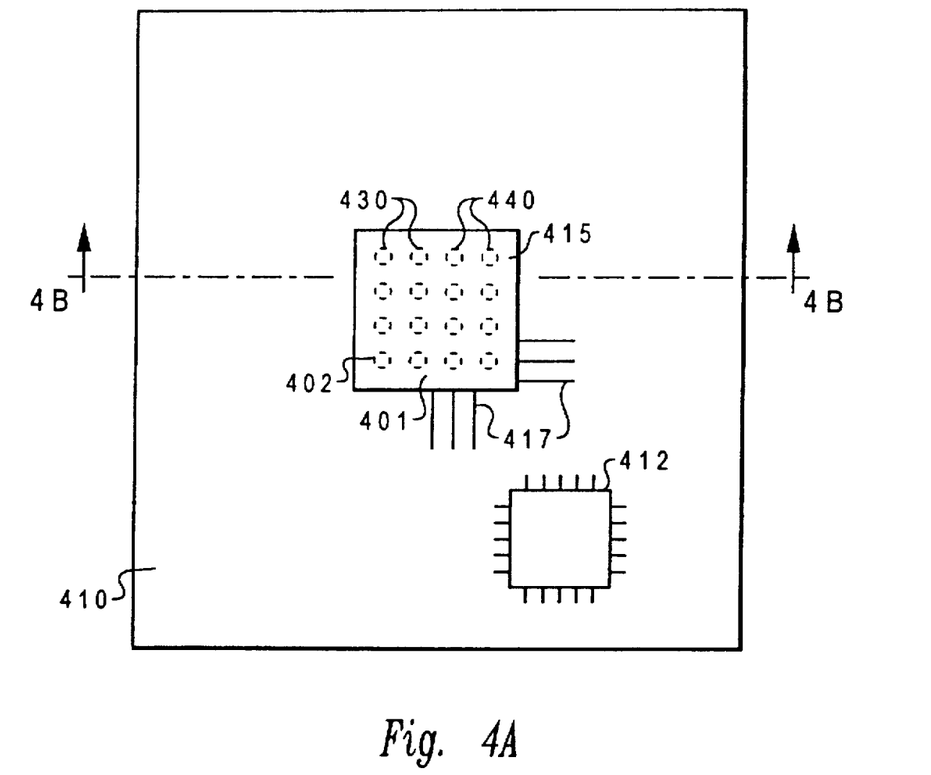
FIG. 4A depicts a printed circuit board with an implementation of the current invention.

The principle of using an electrically conductive paste to test for known good die using a dedicated testing apparatus can be applied to testing for good die on a printed circuit board. FIG. 4A depicts a printed circuit board capable of using electrically conductive paste to test for known good die. Printed circuit board 410 would normally contain a number of other components which would be electrically connected to contact pads 430, however, for clarity, only a single quad-flat-pack chip (QFP) 412 is shown.

Printed circuit board 410 also includes chip site 415, which, in turn, contains a plurality of contact pads 430. Like the test apparatus shown in FIGS. 1A and 3A, contact pads 430 are electrically joined to the rest of printed circuit board 410. Overlaying contact pads 430 is pattern of electrically conductive paste 440. This pattern of electrically conductive paste is used to electrically join an integrated circuit die to printed circuit board 410. In the preferred embodiment of this invention, this paste is comprised of ultra-fine unreflowed solder paste. Unreflowed solder paste is a homogeneous mixture comprised of minute solder particles, solvent, flux, and other chemicals. Upon being heated, the non-solder portions of the paste separate from the paste, leaving only the solder in the solder joint. In addition to unreflowed solder paste, conductive gels, adhesives, and polymers may be used to electrically join contact pads 430 with integrated circuit die 401. Depending on the type of paste used, the flux may or may not be removed subsequent to the reflow process.

Integrated circuit die 401 sits on top of contact pads 430. Integrated circuit die 401 is positioned in such a way as to "sandwich" pattern of electrically conductive paste 440 between attachment pads 402 and contact pads 430. QFP 412 is connected to integrated circuit die 401 by fanout circuitry 417, of which only a portion is shown in FIG. 4A.

Figure 4B:
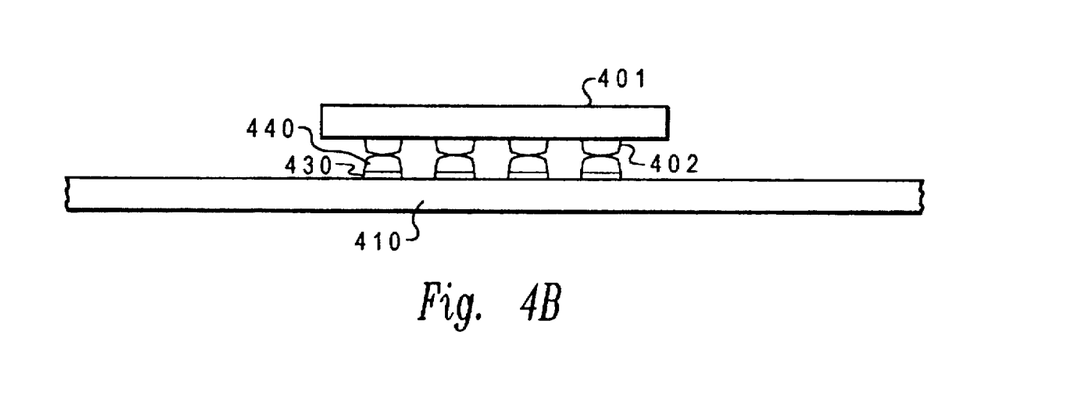
FIG. 4B shows a different perspective of FIG. 4A.

FIG. 4B shows a different perspective of printed circuit board 410 than that of FIG. 4A. In a manner similar to that shown in FIG. 3B, FIG. 4B depicts how the unreflowed solder paste is used to electrically join integrated circuit die 401 to contact pads 430.

Using unreflowed solder paste allows the testing for known good die to be easily integrated into the production process. After the die has been placed onto a chip site containing a pattern of electrically conductive paste, the die is then electrically joined to the printed circuit board. At this time, the die can be electrically tested. If the die test bad, it is removed, then the old pattern of electrically conductive paste is removed from the printed circuit board, and a new pattern of electrically conductive paste is applied. Next, a new die is placed into the chip site, and the process is repeated.

If the die test good, it is left in place on the printed circuit board. The board is then run through a reflow process. This reflow process applies heat to the printed circuit board which melts the solder paste and causes a good solder joint to be formed. Upon the completion of this process, the integrated circuit die is soldered to the printed circuit board. It is important to note that this process is compatible with area array module technologies such as BGA (ball grid array) and CGA (column grid array). These technologies make removing and replacing a die that has already been run through a reflow process very difficult and expensive. Hence, being able to test a die before soldering it to the printed circuit board is important.

Figure 5:
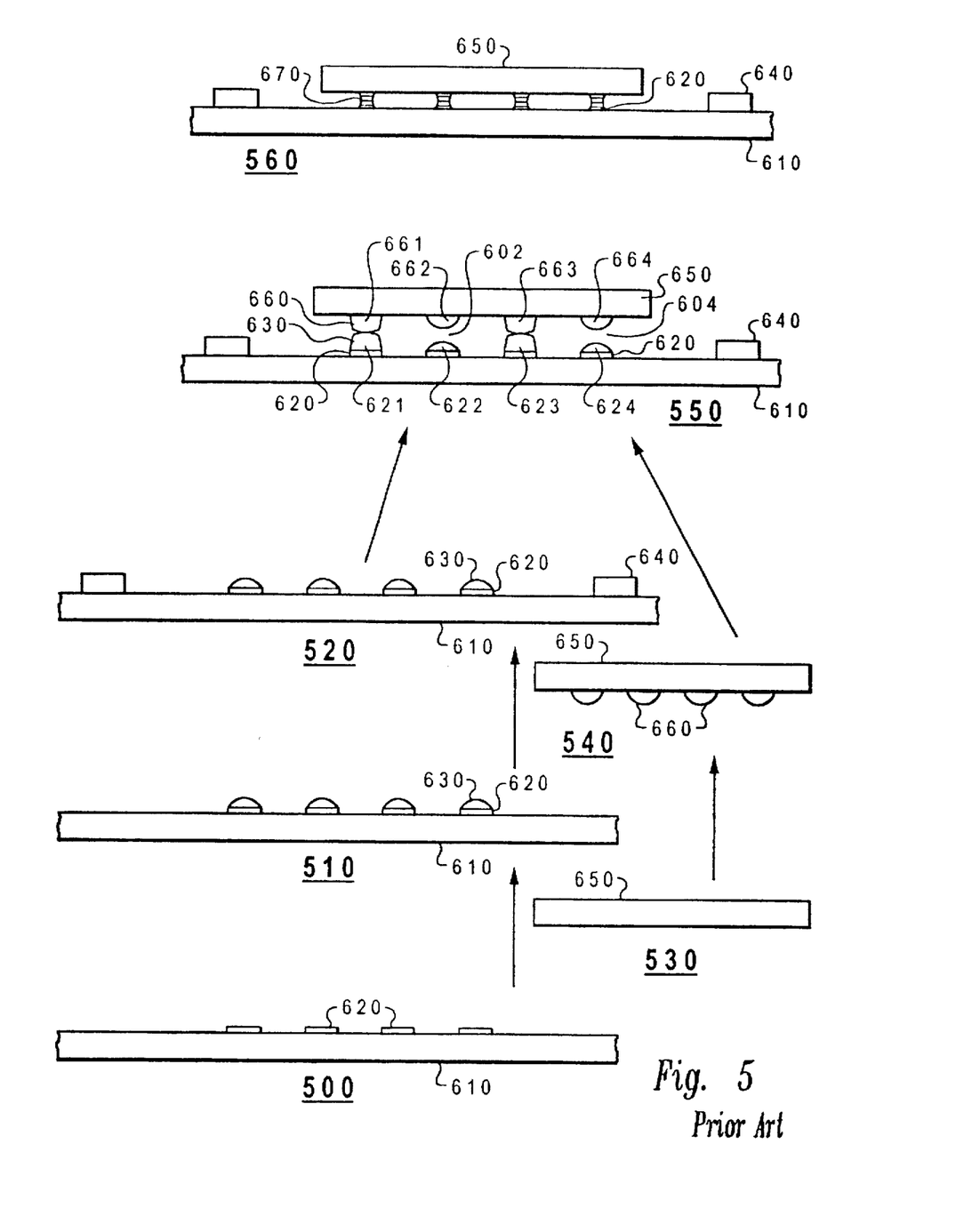
FIG. 5 depicts a prior art process of attaching an integrated circuit die to a printed circuit board.

FIG. 5 illustrates a prior art process by which an integrated circuit die is normally attached to a printed circuit board. In step 500, printed circuit board 610 is shown, along with contact pads 620. In step 510, printed circuit board 610 is subjected to a device mounting pads process which applies an amount of solder or other metal to contact pads 620. The results of this process are shown as contact bumps 630 in step 510. This bumping process deposits upon contact pads 620 a small amount of solder or other metal. This solder or other metal will help to join an integrated circuit die to printed circuit board 610. In step 520, other devices 640 are attached to printed circuit board 610. These devices may include surface mount devices or any other type of electrical devices.

In step 530, there is depicted integrated circuit die 650. In step 540, integrated circuit die 650 is subjected to a bumping process which deposits a small amount of solder or other metal, resulting in attachment bumps 660.

In step 550, printed circuit board 610 is illustrated, along with integrated circuit die 650. Integrated circuit die 650 is positioned so that its attachment bumps 660 are aligned with contact bumps 630 on printed circuit board 610. In the present invention, there would exist a pattern of electrically conductive paste between contact bumps 630 and attachment bumps 660. This electrically conductive paste would electrically join integrated circuit die 650 to printed circuit board 610, thereby allowing the integrated circuit die to be tested. However, in this prior art implementation, the contacts formed between integrated circuit die 650 and printed circuit board 610 do not allow for electrical testing.

Current technology does not allow for the heights of either contact bumps 630 or attachment bumps 660 to be precisely controlled. Thus, some bumps will be higher than others. Having some bumps being higher than others means that the shorter bumps will not make contact with the bump directly across from it. As shown in Step 550, attachment bumps 661 and 663 are taller than attachment bumps 662 and 664. Also, contact bumps 621 and 623 are higher than contact bumps 622 and 624. These inequalities in height create gaps 602 and 604 when integrated circuit die 650 is placed on top of attachment bumps 660. Gaps 602 and 604 prevent the electrical testing of integrated circuit die 650.

Step 560 shows how integrated circuit die 650 is joined to printed circuit board 610 after being run through a reflow process. During this reflow process, either attachment bumps 660 or contact bumps 630, or both attachment bumps 660 and contact bumps 650, can be melted. This allows the attachment bumps and contact bumps to join together to form solder joint 670. Once the reflow process is complete, integrated circuit die may be under filled with encapsulant.

Figure 6:
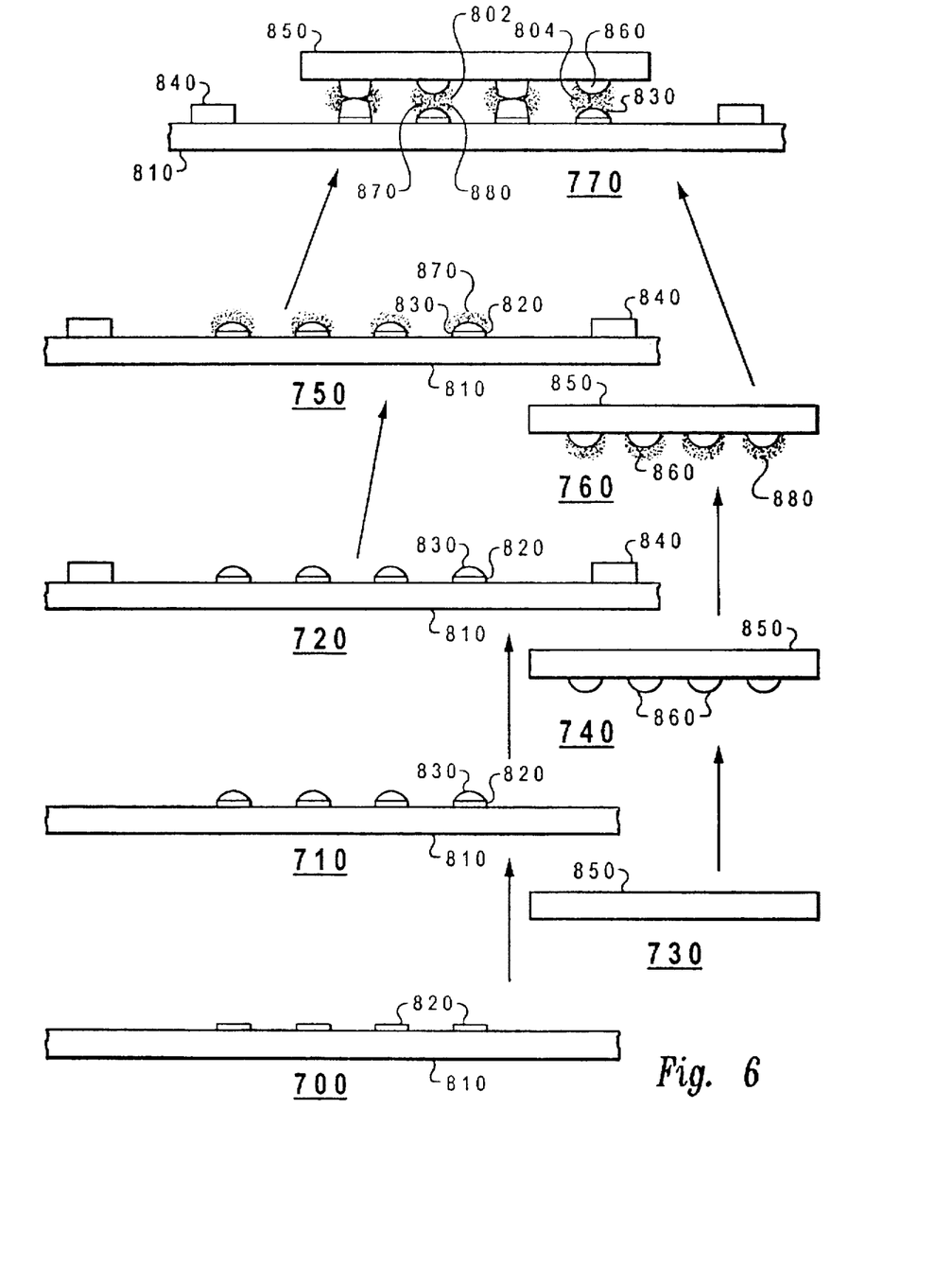
FIG. 6 shows the process of attaching an integrated circuit die to a printed circuit board according to the current invention.

FIG. 6 illustrates a process which partially corresponds to the prior art process, yet performs the current invention. Steps 700, 710, 720, 730, and 740 correspond to steps 500, 510, 520, 530, and 540, in FIG. 5, respectively. The current invention begins in step 750, where contact bumps 830 have been screened with pattern of ultra-fine electrically conductive paste 870. This pattern of electrically conductive paste will allow integrated circuit die 850 to be electrically joined to printed circuit board 810 to allow testing of integrated circuit die 850 prior to the reflow process. Ultra-fine electrically conductive paste 870 fills in gaps 802 and 804 that are formed between the shorter bumps, thereby making a good electrical connection.

Step 760 depicts integrated circuit die 850 with attachment bumps 860 screened with pattern of electrically conductive paste 880. Both contact bumps 830, shown on printed circuit board 810, and attachment bumps 860 need not be screened with a pattern of electrically conductive paste. Only one of them must be screened with the pattern of electrically conductive paste. In the preferred embodiment, only contact bumps 830 are screened.

In step 770, integrated circuit die 850 is placed on top of printed circuit board 810. Integrated circuit die 850 is positioned such that its attachment bumps 860 are aligned with contact bumps 830. In between and around attachment bumps 860 and contact bumps 830 is electrically conductive paste 880 and 870. This paste secures, both physically and electrically, integrated circuit die 850 to printed circuit board 810. From this position, integrated circuit die 850 can be electrically tested. If integrated circuit die 850 does not pass the electrical test, it is discarded, and printed circuit board 810 is re-screened with a pattern of electrically conductive paste as is shown in step 750. Otherwise, if integrated circuit die 850 passes the electrical test, the circuit board is put through a reflow process to permanently attach integrated circuit die 850 to printed circuit board 810.

The foregoing description of a preferred embodiment of the invention has been presented for the purpose of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of testing for known good die comprising:
   a. providing an printed circuit board having:
      i. a chip site capable of receiving an integrated circuit die;
      ii. a plurality of conducting contact pads located within said chip site; and
      iii. a plurality of test points electrically coupled to said plurality of conducting contact pads, said plurality of test points capable of communicating electrical signals to an integrated circuit die located in said chip site via said plurality of conducting contact pads;
   b. providing a pattern of electrically conductive unreflowed solder paste; said pattern of electrically conductive unreflowed solder paste being in electrical communication with said plurality of conducting contact pads and capable of electrically coupling an integrated circuit die to said plurality of conducting contact pads;
   c. providing an integrated circuit die; said integrated circuit die being disposed within said chip site, and said integrated circuit die being electrically coupled to said plurality of contact pads by said pattern of electrically conductive unreflowed solder paste;
   d. utilizing said pattern of electrically conductive unreflowed solder paste to electrically connect said integrated circuit die to said plurality of conducting contact pads;
   e. testing said integrated circuit die from said plurality of test points;
   f. after a successful test of said integrated circuit die, leaving said integrated circuit die in place on said printed circuit board; and
   g. running said printed circuit board through a reflow process to solder said integrated circuit die to said printed circuit board.

2. A method as described in claim 1 wherein the portion of said integrated circuit die that is electrically coupled to said contact pads by said pattern of electrically conductive unreflowed paste is comprised of at least one of:
   a. area array attach pads; and
   b. solder bumps.

3. A method as described in claim 1 further comprising:
   a. after a non-successful test of said integrated circuit die; removing said integrated circuit die from said printed circuit board;
   b. redressing the chip site previously containing said integrated circuit die with additional said electrically conductive unreflowed solder paste;
   c. placing a new integrated circuit die onto said chip site; and
   d. testing said new integrated circuit die.

4. A method as described in claim 1 wherein said integrated circuit carrier is a testing circuit board.

5. A method as described in claim 4 further comprising:
   a. after a successful test of said integrated circuit die, washing said electrically conductive unreflowed solder paste from said integrated circuit die; then
   b. subjecting said integrated circuit die to a drying operation.

6. A method as described in claim 1 wherein said step of providing a pattern of electrically conductive unreflowed solder paste is accomplished using conventional manufacturing stencil operations.

7. A method as described in claim 1 wherein said pattern of electrically conductive unreflowed solder paste is soluble in at least one of the following:
   i. water;
   ii. a water and saponifier solution;
   iii. terpene; and
   iv. CFCs.

8. An method as described in claim 1 wherein said integrated circuit carrier is a substrate selected from a group consisting of:
   a. Single Chip Module, Ceramic;
   b. Multi Chip Module, Ceramic;
   c. Single Chip Module, Laminate; and
   d. Multi Chip Module, Laminate.

* * * * *